(12) United States Patent
Beerens et al.

(10) Patent No.: US 9,141,003 B2
(45) Date of Patent: Sep. 22, 2015

(54) LITHOGRAPHIC APPARATUS AND DEVICE MANUFACTURING METHOD

(75) Inventors: Ruud Antonius Catharina Maria Beerens, Roggel (NL); Sjoerd Nicolaas Lambertus Donders, Vught (NL); Engelbertus Antonius Fransiscus Van Der Pasch, Oirschot (NL); Bastiaan Lambertus Wilhelmus Marinus Van De Ven, Rosmalen (NL); Johannes Petrus Martinus Bernardus Vermeulen, Helmond (NL)

(73) Assignee: ASML NETHERLANDS B.V., Veldhoven (NL)

( * ) Notice: Subject to any disclaimer, the term of this patent is extended or adjusted under 35 U.S.C. 154(b) by 770 days.

(21) Appl. No.: 12/902,847

(22) Filed: Oct. 12, 2010

(65) Prior Publication Data

US 2011/0085180 A1   Apr. 14, 2011

Related U.S. Application Data

(60) Provisional application No. 61/252,949, filed on Oct. 19, 2009, provisional application No. 61/251,186, filed on Oct. 13, 2009.

(51) Int. Cl.
  *G01B 11/14* (2006.01)
  *G03F 7/20* (2006.01)
  *G01B 9/02* (2006.01)

(52) U.S. Cl.
  CPC ............ *G03F 7/7085* (2013.01); *G01B 9/02* (2013.01); *G01B 9/02049* (2013.01); *G01B 11/14* (2013.01); *G03F 7/70766* (2013.01); *G03F 7/70775* (2013.01); *G01B 2290/70* (2013.01)

(58) Field of Classification Search
  CPC .. G03F 7/70775; G01B 2290/70; G01B 9/02; G01B 11/14; G01B 9/02049
  USPC ........... 356/500, 401, 509, 493, 498
  See application file for complete search history.

(56) References Cited

U.S. PATENT DOCUMENTS 4,188,122 A * 2/1980 Massie et al. ............... 356/489
4,688,940 A * 8/1987 Sommargren et al. ...... 356/487

(Continued)

FOREIGN PATENT DOCUMENTS

JP   11-173808    7/1999
JP   2001-510577  7/2001

(Continued)

OTHER PUBLICATIONS

Japanese Office Action mailed Apr. 25, 2012 in corresponding Japanese Patent Application No. 2010-226129.

(Continued)

*Primary Examiner* — Kara E Geisel
*Assistant Examiner* — Dominic J Bologna
(74) *Attorney, Agent, or Firm* — Pillsbury Winthrop Shaw Pittman LLP

(57) ABSTRACT

A position measurement system configured to measure a position quantity of a movable object in a measurement direction, the system including a radiation source, a beam splitter to split the radiation beam in a measurement beam and a reference beam, a first reflective surface mounted on the movable object to receive the measurement beam, a second reflective surface mounted on a reference object to receive the reference beam, and a detector arranged to receive a first and second reflected beam reflected by the first and second reflective surface, respectively, and configured to provide a signal representative of the position quantity of the movable object based on the first and the second beam, wherein the radiation source and detector are mounted on an object that is different from the movable object and the reference object.

18 Claims, 7 Drawing Sheets

(56) References Cited

U.S. PATENT DOCUMENTS

| | | | |
|---|---|---|---|
| 5,249,030 A * | 9/1993 | Field et al. | 356/487 |
| 5,416,562 A * | 5/1995 | Ota et al. | 355/53 |
| 6,020,964 A * | 2/2000 | Loopstra et al. | 356/500 |
| 7,502,103 B2 * | 3/2009 | Plug et al. | 356/237.2 |
| 2003/0020921 A1 * | 1/2003 | Hill | 356/493 |
| 2004/0008331 A1 * | 1/2004 | Cox et al. | 355/53 |
| 2004/0218262 A1 * | 11/2004 | Chuang et al. | 359/366 |
| 2005/0094155 A1 * | 5/2005 | Hill et al. | 356/500 |
| 2005/0111005 A1 * | 5/2005 | Eussen et al. | 356/498 |
| 2005/0168755 A1 * | 8/2005 | Hill | 356/500 |
| 2007/0127035 A1 * | 6/2007 | Demarest | 356/498 |
| 2007/0263197 A1 * | 11/2007 | Luttikhuis et al. | 355/55 |

FOREIGN PATENT DOCUMENTS

| | | | | |
|---|---|---|---|---|
| JP | 2001-264008 | | 9/2001 | |
| JP | 2001264008 A | * | 9/2001 | G01B 9/02 |
| JP | 2001-307983 | | 11/2001 | |
| JP | 2003-309055 | | 10/2003 | |
| JP | 2005-045050 | | 2/2005 | |
| JP | 2007-052022 | | 3/2007 | |

OTHER PUBLICATIONS

Japanese Office Action mailed Apr. 11, 2013 in corresponding Japanese Patent Application No. 2010-226129.

\* cited by examiner

LITHOGRAPHIC APPARATUS AND DEVICE MANUFACTURING METHOD

CROSS REFERENCE TO RELATED APPLICATIONS

This application claims priority and benefit under 35 U.S.C. §119(e) to U.S. Provisional Patent Application No. 61/251,186, entitled "Lithographic Apparatus and Device Manufacturing Method", filed on Oct. 13, 2009 and U.S. Provisional Patent Application No. 61/252,949, entitled "Lithographic Apparatus and Device Manufacturing Method", filed on Oct. 19, 2009. The contents of these applications are incorporated herein in their entirety by reference.

FIELD

The present invention relates to a position measurement system, and a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Position measurement systems are used for position measurement of different parts of a known lithographic apparatus. In particular, for objects which have to be positioned with high accuracy, such as the patterning device support and the substrate support of a scanning type lithographic apparatus, it is desirable to determine the position with high accuracy.

Both laser interferometric as encoder-type position measurement systems are applied in position measurement systems of known lithographic apparatus. As prior art interferometric systems may be more susceptible to environmental influences, a general preference is given to encoder type measurement systems including one or more encoder heads on a first object and a grid or grating on another object.

In one application of a position measurement of a patterning device stage system, the encoder heads are arranged on a reference object, while the grid or grating is arranged on the movable object of which the position is to be determined. As a result, relative long grid plates are used on the movable object to cover the whole range of movement. This prevents direct patterning device position measurement, i.e. direct determination of the position of the patterning device using a grid or grating provided on the patterning device itself. As a consequence of the presence of the relative large grid plate, the moving mass and dynamic performance of patterning device support may be negatively influenced. Also, the thermal expansion of the moving grid plate should be controlled in order to obtain reliable measurements.

Another alternative encoder-type position measurement system includes encoder heads that are mounted on the substrate support stage system, and the grid plate is mounted on the stationary frame. As a result, the data transfer and power cables to the encoder heads are arranged on the moving substrate support. In this arrangement, fibers move at high velocities and accelerations, and deteriorate stage dynamics and conditioning, as well as reliability, especially for targeted high accelerations.

SUMMARY

It is desirable to provide an alternative position measurement system for measuring a position quantity of a movable object with high accuracy.

According to an embodiment of the invention, there is provided a position measurement system configured to measure a position quantity of a movable object in a measurement direction. The position measurement system includes a radiation source to emit a radiation beam, a beam splitter or splitting device to split the radiation beam in a measurement beam and a reference beam, a first reflective surface mounted on the movable object to receive the measurement beam, a second reflective surface mounted on a reference object to receive the reference beam, and a detector arranged to receive a first reflected beam reflected by the first reflective surface and a second reflected beam reflected by the second reflective surface, and configured to provide a signal representative of the position quantity of the movable object on the basis of the first and second beam, wherein the radiation source and detector are mounted on another object than the movable object and the reference object.

According to an embodiment of the invention, there is provided a lithographic apparatus including: a support constructed to support a patterning device, the patterning device being capable of imparting the beam of radiation with a pattern in its cross-section to form a patterned beam of radiation; a substrate table constructed to hold a substrate; and a projection system configured to project the patterned beam of radiation onto a target portion of the substrate, wherein the lithographic apparatus includes a position measurement system configured to measure a position quantity of a movable object in a measurement direction, including: a radiation source to emit a radiation beam, a beam splitter or splitting device to split the radiation beam in a measurement beam and a reference beam, a first reflective surface mounted on the movable object to receive the measurement beam, a second reflective surface mounted on the reference object to receive the reference beam, and a detector arranged to receive a first reflected beam reflected by the first reflective surface and a second reflected beam reflected by the second reflective surface, the detector configured to provide a signal representative of the position quantity of the movable object on the basis of the first and second beam, wherein the radiation source and detector are mounted on another object than the movable object and the reference object.

According to an embodiment of the invention, there is provided a lithographic apparatus including: an illumination system configured to condition a beam of radiation; a support constructed to support a patterning device, the patterning device being capable of imparting the beam of radiation with a pattern in its cross-section to form a patterned beam of radiation; a substrate table constructed to hold a substrate;

and a projection system configured to project the patterned beam of radiation onto a target portion of the substrate, wherein the lithographic apparatus includes a position measurement system configured to measure a position quantity of a movable object in a measurement direction, the system including: a radiation source to emit a radiation beam, a first reflective and/or diffractive surface mounted on the movable object to receive a measurement beam, a second reflective and/or diffractive surface mounted on the reference object to receive a reference beam and/or beams diffracted by the first diffracted surface, and a detector arranged to receive a first beam from the first reflective and/or diffractive surface, possibly via the second diffractive surface, and a second beam from the second reflective and/or diffractive surface, and configured to provide a signal representative of the position quantity of the movable object on the basis of the first and second beam, wherein the radiation source and detector are arranged on a balance mass of a stage system of the support or substrate table.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
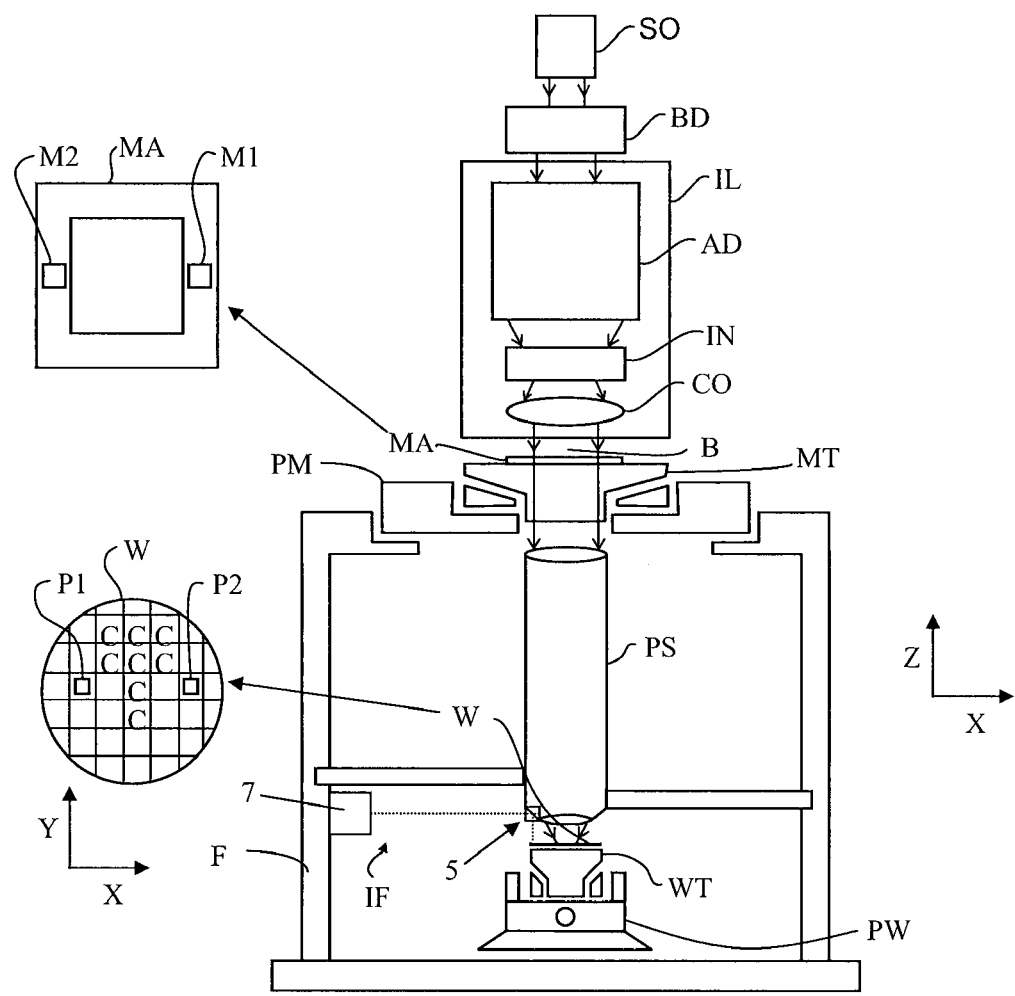
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a beam of radiation B (e.g. UV radiation or any other suitable radiation), a patterning device support or mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the beam of radiation B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the beam of radiation may not exactly correspond to the desired pattern in the target portion of the substrate, for example if the pattern includes phase-shifting features or so called assist features. Generally, the pattern imparted to the beam of radiation will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the beam of radiation. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the beam of radiation, to have a desired uniformity and intensity distribution in its cross-section.

The beam of radiation B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
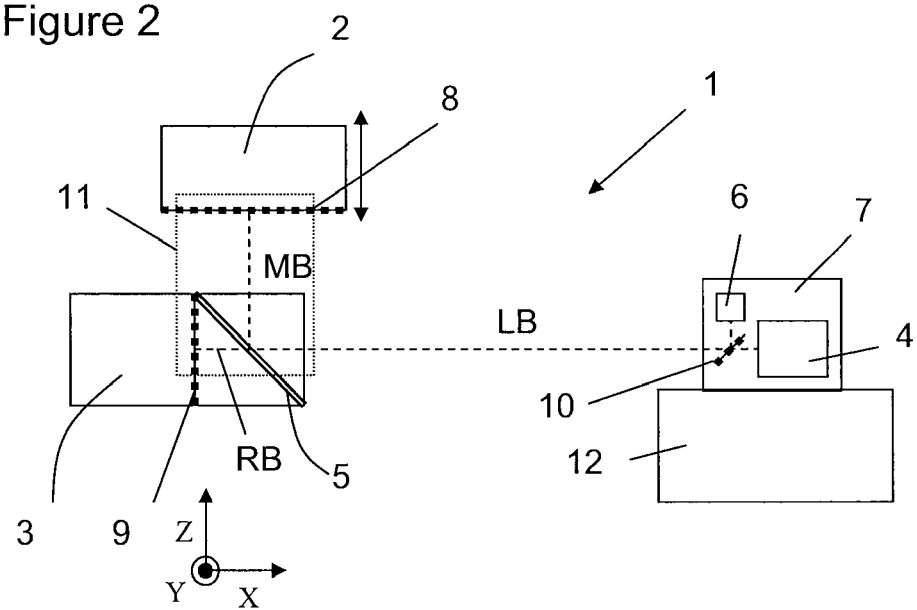
FIG. 2 depicts an embodiment of a position measurement system according to the invention.

FIG. 2 shows an embodiment of a position measurement system of the invention, generally indicated with the reference numeral 1. The position measurement system 1 is configured to measure a position quantity of a movable object 2, for instance a patterning device, in a measurement direction with respect to a reference object 3, for instance a projection system.

The position quantity determined by the position measurement system 1 may be a position or position change, but also speed, acceleration or any other relevant quantity related to the position of the movable object. The position measurement system as shown in FIG. 2 is configured to measure the position quantity of the movable object 2 in one measurement direction parallel to the z-axis. This detectable movement of the movable object 2 is indicated by a double headed arrow. Further measurement systems may be provided to measure position quantities in other directions to obtain the position, or other relevant quantity in a desired number of degrees of freedom, preferably six degrees of freedom. These further measurement systems may be integrated in the position measurement system shown in FIG. 2 to obtain a single integrated system, or may be provided as separate position measurement systems.

The position measurement system 1 includes a light or radiation source 4, a beam splitter or beam splitting device 5 and a detector 6. The radiation source 4 is configured to emit a light or radiation beam LB, for instance a laser beam. The radiation source 4 and the detector 6 are housed in a single radiation source and detector unit 7, but may also be provided in separate units.

The beam splitter 5 is arranged to receive the radiation beam LB, directly or via one or more reflective and/or refractive surfaces and configured to split the beam into two beams, a measurement beam MB and a reference beam RB. The beam splitter 5 usually includes a surface that is partially reflective and partially transparent for the respective radiation beam. In the embodiment of FIG. 2, the beam splitter 5 is a semi-reflective surface arranged at an angle of about 45 degrees with the x-axis and the z-axis.

The radiation beam LB emitted by the radiation source 4 runs or propagates in a plane substantially perpendicular to the measurement direction when encountering the beam splitter 5. Part of the radiation beam LB is reflected by the beam splitter 5 resulting in a measurement beam MB, and the rest of the radiation beam LB passes the beam splitter resulting in a reference beam RB. The radiation beam may run parallel, where the reflected part of the radiation beam LB results in a reference beam RB, and the refracted part of the radiation beam LB results in a measurement beam MB.

The measurement beam MB is guided to a reflective surface 8 on the movable object 2, which reflects the beam over the same path back to the beam splitter 5, where it is reflected back to the radiation source and detector unit 7. Correspondingly, the reference beam RB is reflected by a second reflective surface 9 arranged on the reference object 3, back to the radiation source and detector unit 7. The first and second reflective surfaces 8, 9 may be polarizing reflective surfaces in view of signal enhancement.

In the radiation source and detector unit 7, a small mirror 10, or similar device, is provided to guide the measurement beam MB and the reference beam RB to the detector 6.

At the beam splitter 5, the measurement beam MB and reference beam RB interfere and run over the same path towards the radiation source and detector unit 7. Any phase difference between the measurement beam MB and the reference beam RB as a result of the different paths of these beams results in intensity differences in the combined radiation beam, i.e. the combination of between the measurement beam MB and the reference beam RB. The detector 6 is configured to measure intensity differences in the combined radiation beam falling on the detector 6. These changes in the measured intensity are a measure for a position quantity of the movable object 2, in particular a change in position of the movable object 2 with respect to object 3.

It is remarked that the radiation source 4 and/or detector 6 may also include a fiber or such which guides the respective radiation beam(s) from or to any other suitable location.

In the embodiment of FIG. 2, the radiation source and detector unit 7 is arranged on another object 12 than the beam splitter 5 which is arranged on the reference object 3. Also, the radiation source and detector unit 7 is arranged on another object than the movable object 2.

This has the benefit that no power or data transfer cables required for the radiation source 4 and the detector 6 have to be guided to and arranged on the reference object 3 and/or the movable object 2.

When for instance the movable object 2 is a stage of a lithographic apparatus and the reference object is part of the projection system, the radiation source and detector unit 7 may be arranged on the base frame or metroframe or any other suitable location. Also, since the radiation source and detector unit 7 does not have to be provided close to the movable object 2 and the reference object 3 there is more freedom to choose a suitable location for mounting the radiation source and detector unit 7.

Furthermore, it is beneficial that the beam splitter 5 is arranged relative close to the movable object 2 and the reference object 3. As a result, the signal construction space 11, i.e. the space taken by the paths of the beams from the location of the beam splitter 5 where the radiation beam is split in measurement beam MB and reference beam RB to the reflective surfaces 8 and 9 and back to the beam splitter 5 where the beams again follow the same path, is relative small. As the signal construction area 11 is small, the risk on deterioration of the measurement result due to environmental fluctuations is decreased.

It is remarked that in case the radiation source and detector unit 7 is arranged at the same object but at a considerable distance from the beam splitter 5, movable object 2 and/or reference object 3, for the above discussed reasons, the location of the radiation source and detector unit 7 must in the line of the present invention be regarded to be arranged on a different object than the movable object 2 and/or the reference object 3 and/or the beam splitter 5.

In the position measurement system 1 of FIG. 2, a direct measurement is obtained between the movable object 2 and the reference object 3, and the movable object 2 and reference object 3 may be arranged at a relative large distance from the radiation source and detector unit 7. Thereby, it is remarked that due to the configuration wherein the beam splitter 5 is attached to reference object 3 movements parallel to the Z-axis of the reference object 3 with respect to the movable object 2 and/or the detector unit 7 may be determined as well. For instance, a vertical displacement of the reference object 3 will result in a longer beam path of the reference beam RB between the beam splitter 5 and the reflective surface 9, while the length of the beam path of the measurement beam MB between the beam splitter 5 and the reflective surface 8 remains the same. As a result, such vertical displacement of the reference object 3 may be determined.

Also, solely movements in Z-direction are measured. In conventional laser interferometry where the beam splitter 5 is replaced by a reflective surface, a second measurement is required to discriminate between movement of the reference object 3 in X-direction and movement of the reference object 3 and/or movable object 2 in Z-direction. This second measurement is not required in the configuration of FIG. 2, since the length of the beam path of the reference beam RB between the beam splitter 5 and the reflective surface 9 will not change due to a movement of the reference object 3 in the X and/or Y direction.

Now again referring to FIG. 1, the position measurement system IF is a position measurement system in accordance with an embodiment of the invention. The radiation source and detector unit 7 is mounted on a frame F of the lithographic apparatus, while the beam splitter 5 is arranged on the projection system PS which is also the reference object for the position measurement system. The movable object is the substrate W supported on the substrate support WS which is movable in order to perform scanning movements. The substrate W includes a reflective surface to reflect the measurement beam MB.

By providing this position measurement system, direct measurement is obtained between the substrate W and the projection system PS without the influence of environmental effects, such as thermal effects or pressure variations, between the actual reference object, i.e. the projection system and the location of the radiation source and detector unit 7 which in prior art interferometric position measurement systems also includes the beam splitter and the reference reflective surface.

FIGS. 3-10 show alternative embodiments of a position measurement system according to the invention. The same parts of the position measurement system, or parts having substantially the same function have been indicated with the same reference numerals.

Figure 3:
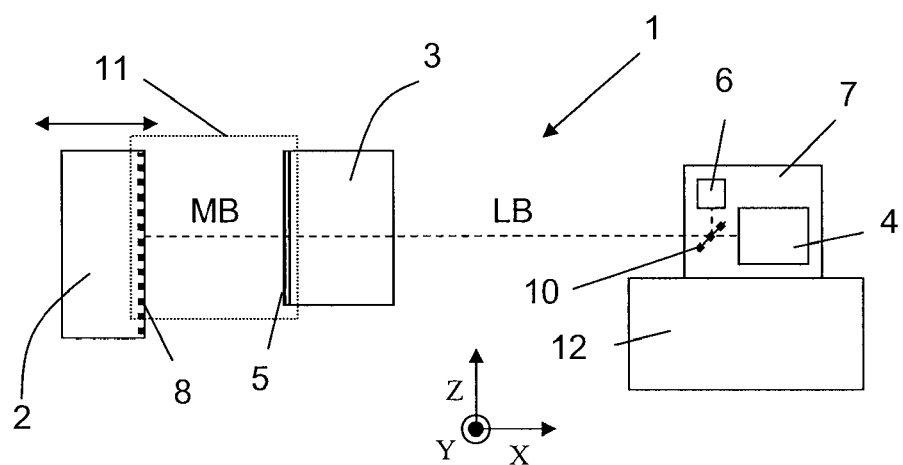
FIG. 3 depicts an embodiment of a position measurement system according to the invention.

In the embodiment of FIG. 3, a position measurement system 1 is provided to measure a position quantity between the movable object 2 and the reference object 3 in a measurement direction substantially parallel to the x-direction. The beam splitter 5 is a semi-transparent mirror being arranged on the reference object 3 at an angle of about 90 degrees with the measurement direction. The radiation beam LB originating from the radiation source and detector unit 7, directly or via one or more reflective and/or refractive surfaces, is split at the beam splitter 5 in a measurement beam MB which is reflected by the reflective surface 8 on the movable object 2, and a reference beam which is reflected by the beam splitter back to the radiation source and detector unit 7. In this embodiment the beam splitter 5 and the second reflective surface 9 of FIG. 2 are integrated in a single device, i.e. beam splitter 5. In such embodiment, it could be that the second reflective surface receives the reference beam RB from the beam splitter at the same moment as the reference beam RB is split from the radiation beam.

The measurement beam MB and the reference beam RB are guided back to the radiation source and detector unit 7 where the detector 6 receives a signal representative of the movement of the movable object 2 with respect to the reference object 3.

The embodiment as shown in FIG. 3 may in particular be useful for performing a gap measurement between the long stroke and short stroke parts of a stage system having a short stroke part to position an object with high accuracy and a long stroke part supporting the short stroke part to move the short stroke part over a relative large range.

Figure 4:
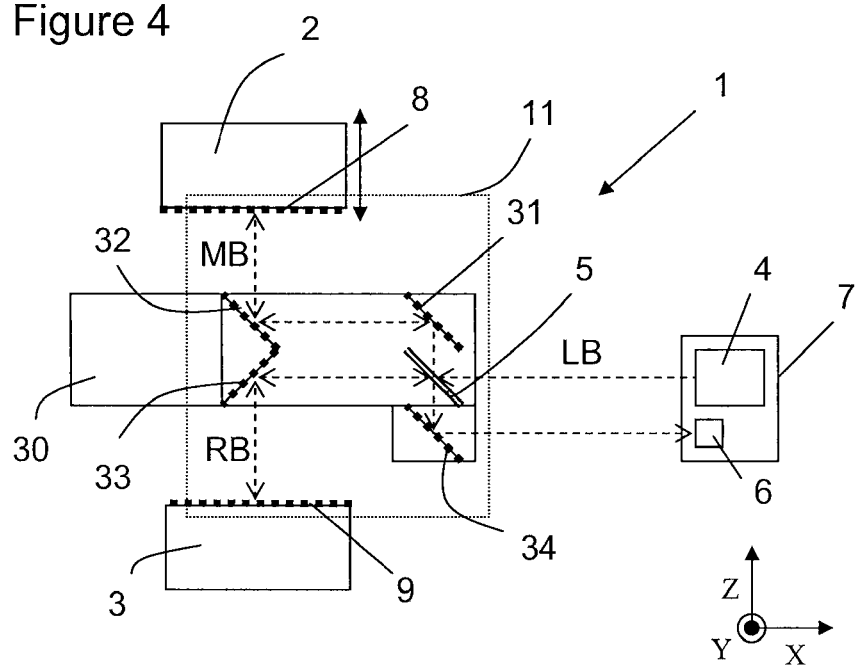
FIG. 4 depicts an embodiment of a position measurement system according to the invention.

FIG. 4 shows another alternative embodiment of position measurement system 1 according to the invention. In the position measurement system of FIG. 4, an intermediate object 30 is provided between the movable object 2 and the reference object 3 and a quarter lambda plate 35 is arranged near the intermediate object 30 in the light path of the measurement beam MB and the reference beam RB. Such intermediate object 30 may for instance be a part of a patterning device support between the patterning device (movable object) and the projection system (reference object).

The use of such intermediate object 30 may be beneficial when the reference object 3 and/or the movable object 2 cannot be reached from the radiation source and detector unit 7 by a radiation beam substantially perpendicular to the measuring direction, for instance in case another object is present between a favorable location of the radiation source and detector unit 7 and the reference object 3. Other benefits of the provision of an intermediate object 30 may for instance be a possible decrease in mass and/or volume of movable object 2 and/or reference object 3, a more suitable or smaller area for the reflective surfaces 8, 9 on the movable object 2 and/or reference object 3, and the possible optimization of optical path difference between the optical paths to the movable object 2 and the reference object 3.

In the embodiment of FIG. 4, a radiation beam LB emitted by the radiation source 4 is received by a beam splitter 5. The beam splitter 5 which is arranged on the intermediate object 30 splits the radiation beam LB in a measurement beam MB which is guided via the reflective surfaces 31, and 32 to the reflective surface 8 on the movable object 2, and a reference beam RB which is guided via reflective surface 33 to the reflective surface 9 on the reference object 3.

Figure 5:
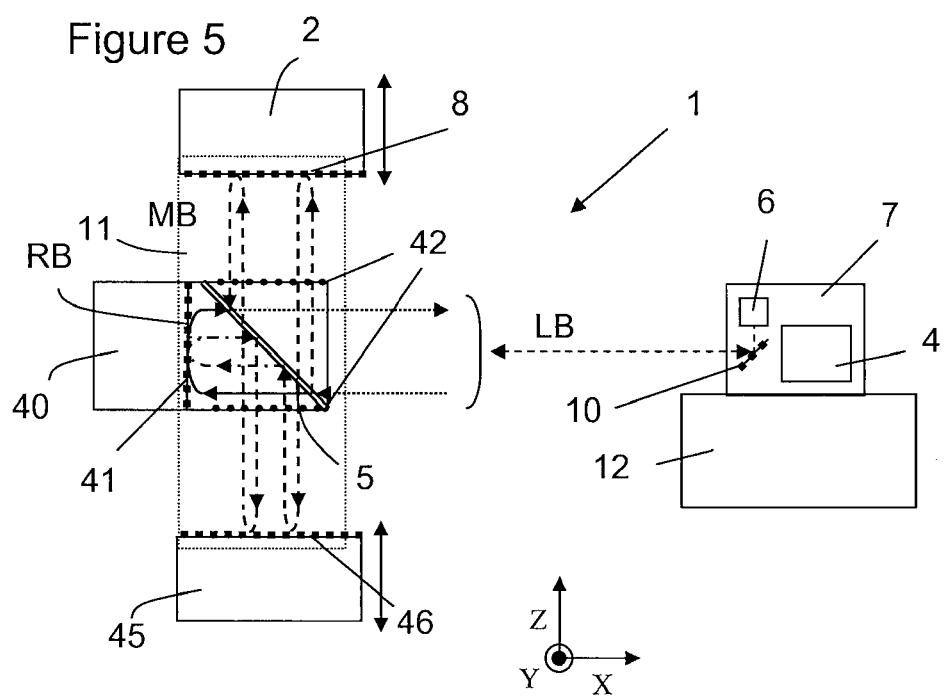
FIG. 5 depicts an embodiment of a position measurement system according to the invention.

The reflected beams of the reflective surfaces 8, 9 are guided back to the beam splitter 5 via the reflective surfaces 31, 32 and 33, respectively. At the beam splitter 5 the reflected beams are combined to a single beam which is guided to the detector 6 via the reflective surface 34. Any change in distance between the movable object 2 and the reference object 3 in the measurement direction Z will result in intensity changes in the single beam received by the detector 6. On the basis of these intensity changes, a position quantity of the movable object 2 with respect to the reference object 3 may be determined. It should be noted that the reflective surface 34 is not necessarily required when the light source and detector unit 7 as described with reference to the FIG. 2, 3 or 5 is used. In that case the quarter lambda plate may also become obsolete.

Also in this embodiment the radiation source and detector unit 7 is arranged at another object than the reference object 3 and the movable object 2. Furthermore, the beam splitter 5 is arranged relative close to the reflective surfaces 8, 9 compared to the radiation source and detector unit 7. As a result the space for signal construction is relatively small.

It is remarked that in this application the term movable object and reference object are used. In practice, in particular the embodiment of FIG. 4 both the reference object 3 and the movable object 2 may move in the measurement direction without moving the object out of the range of the position measurement system 1.

FIG. 5 shows an embodiment wherein a reference object 40 is arranged between the movable object 2 and a second movable or stationary object 45. The measurement beam MB is reflected on both the reflective surface 8 of the movable object 2 and a reflective surface 46 on the second movable object 45. With this measurement beam MB any change in distance between the movable object 2 and the second movable or stationary object 45 may be determined.

Quarter lambda plates 42 are provided in a horizontal plane on the reference object 3 to provide a phase shift in a beam passing the quarter lambda plates 42. This phase shift is used to make the measurement beam run between the movable object 2 and the second movable object 3. Any other suitable phase shifter may also be applied.

The beam splitter 5 is arranged at an angle of about 45 degrees with respect to the measurement direction, i.e. the z-axis. The beam splitter 5 provides a measurement beam MB and a reference beam RB. The beam splitter 5 is a polarizing beam splitter, with the result that the measurement beam MB and the reference beam RB are polarized radiation beams. Any other suitable polarizer or polarizing radiation source may also be used.

The part of the radiation beam reflected by the beam splitter 5 forms the measurement beam MB which runs via the quarter lambda plate 42 to the movable object 2. After being reflected by the reflective surface 8, the measurement beam MB again passes the quarter lambda plate 42 and goes through the beam splitter 5 to the reflective surface 46 on the second movable or stationary object 45. On this reflective surface 46, the measurement beam runs is reflected back via the beam splitter 5 to the reflective surface 8 on the movable object 2 and then back to the beam splitter 5 again passing twice the quarter lambda plate 42. As a result of the phase shift in the quarter lambda plate 42, the measurement beam MB is now reflected on the beam splitter 5 back to the radiation source and detector unit 7. The reference beam RB is reflected by the reflective surface 41 on the reference object 40 back to the light source and detector unit 7. In an alternative configuration, the reflective surface 41 may be replaced by a corner cube for improved insensitivity due to angular misalignment of the stationary object 45.

Figure 6:
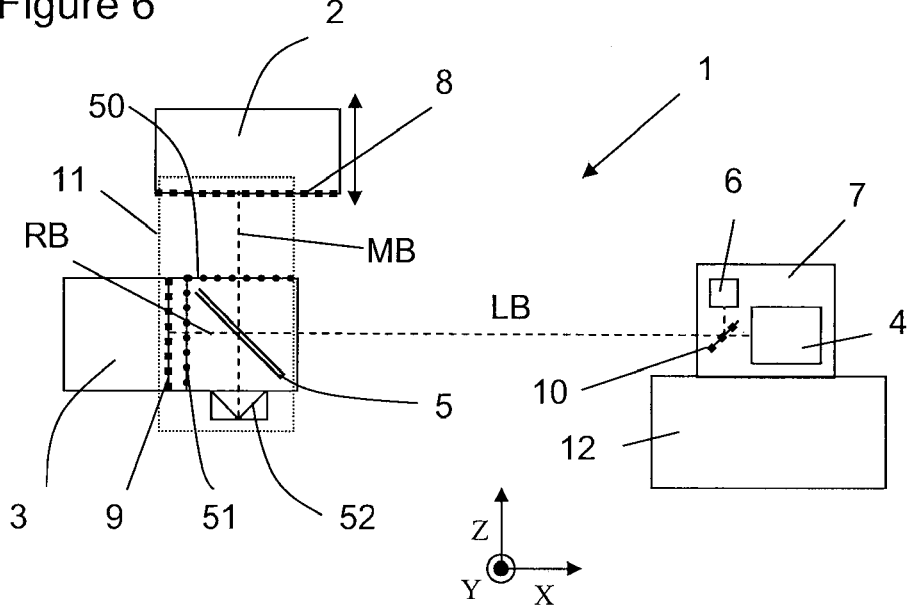
FIGS. 6-10 depict further embodiments of position measurement systems according to the invention.

FIG. 6 shows an alternative embodiment of the embodiment of FIG. 2. In this embodiment, the reference object includes a first quarter lambda plate 50 in the measurement beam MB path and a second quarter lambda plate 51 in the reference beam RB path. Furthermore, a corner cube 52 is arranged at the reference object 3. In another alternative embodiment the second quarter lambda plate 51 and the reflective surface 9 may be replaced by a corner cube.

The radiation beam LB coming from the radiation source and detector unit 7 is split at the beams splitter 5 in a measurement beam MB and reference beam RB. The measurement beam MB is guided to and reflected by the first reflective surface 8 back to the beam splitter 5. As the measurement beam MB passes the first quarter lambda plate 50 twice the phase of the measurement beam MB is shifted such that the measurement beam runs through the beam splitter 5 to the corner cube 52. In the corner cube 52, the measurement beam MB is reflected back to the first reflective surface 8 passing the beam splitter 5 and the first quarter lambda plate 50. After being reflected by the first reflective surface 8 the measurement beam MB again passes the first quarter lambda plate 50 and the measurement beam MB is reflected by the beam splitter 5 towards the radiation source and detector unit 7.

In a similar way the reference beam RB is reflected on the second reflective surface 9 back to the beam splitter 5. Due to the phase shift of passing the second quarter lambda plate 51 twice, the reference beam is reflected on the beam splitter 5 and runs to the corner cube 52 where the reference beam RB is now reflected via the beam splitter 5 back to the second reflective surface 9. From there the reference beam RB will be reflected via the beam splitter 5 back to the radiation source and detector unit 7.

At the beam splitter 5 the measurement beam MB and the reference beam RB interfere, and will run over a corresponding path and any intensity differences in the combined measurement beam and reference beam may be used to determine any change in the position quantity of the movable object 2 in the measurement direction.

The benefit of the corner cube 52 is that the measurement beam MB and reference beam RB are each reflected back over its incoming path, which makes the position measurement 1 less sensitive for misalignment of the beam splitter 5, and/or the first 8 and/or second reflective surface 9. Furthermore, the measurement beam MB runs twice between the movable object 2 and the reference object 3. As a result, the sensitivity of the position measurement system 1 for any change in distance between these two objects is increased.

Figure 7:
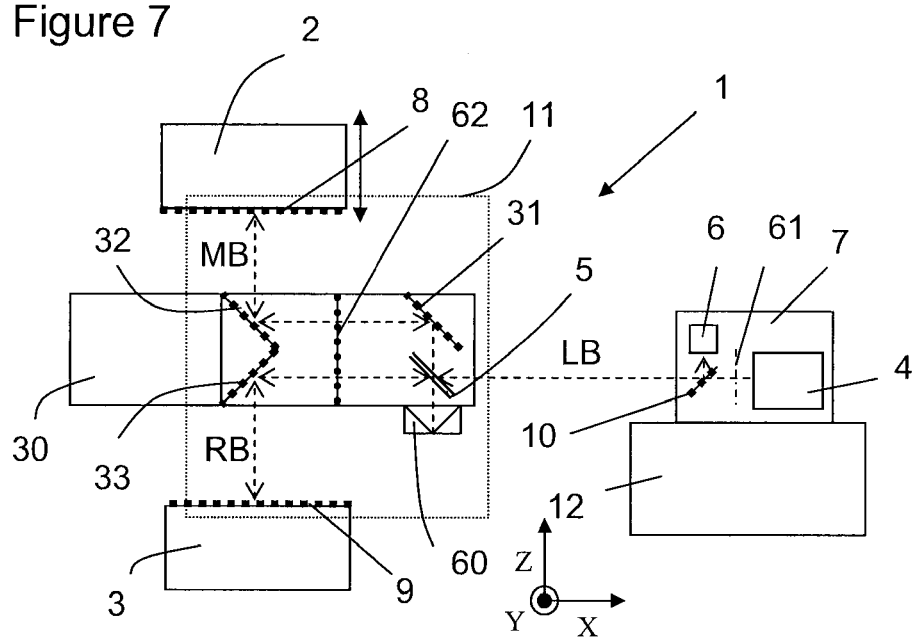

FIG. 7 shows another embodiment of the position measurement system 1 of the invention. The position measurement system 1 is similar to the position measurement system in FIG. 4. A main difference with respect to the position measurement system 1 of FIG. 4 is that in the position measurement system of FIG. 7 a corner cube 60 is arranged at the location of reflective surface 34 of FIG. 4.

Further, in the embodiment of FIG. 7, a quarter lambda plate 62 is arranged at the intermediate object 30 in the light path of the measurement beam MB and the reference beam RB. Furthermore, the beam from and towards the radiation source and detector unit 7 follows the same path. Similar to the radiation source and detector unit 7 of FIG. 2, a reflector 10 is provided to reflect the incoming radiation beam to the detector 6.

As a result of the presence of the corner cube 60 and the quarter lambda plate 62, the measurement beam MB and the reference beam RB are each reflected back over the same path as the path the measurement beam MB and reference beam RB reached the corner cube 60. Thus, the measurement beam MB which has reached the corner cube 60 via the beam splitter 5, and subsequently the reflective surfaces 31, 32, 8, 32, 31, will follow the same path in reverse order back to the radiation source and detection unit 7. Similarly, the reference beam RB which has reached the corner cube 60 via the beam splitter 5, subsequently the reflective surfaces 33, 9, 33, and the beam splitter 5 will follow the same path back to the beam splitter 5 and the radiation source and detection unit 7.

This has the benefit that the relevant distances between the intermediate object 30 and the movable object 2 and intermediate object 30 and the reference object 3 is passed twice which increases the sensitivity of the position measurement system. Furthermore, the position measurement system is less sensitive for misalignment of any of the reflective surfaces 8, 9, 31, 32, 33 and/or the beam splitter 5, since the incoming and reflected beam of the corner cube 60 will be parallel. As a result, any misalignment in the path towards the corner cube will be compensated by misalignment in the opposite direction in the return path.

Figure 8:
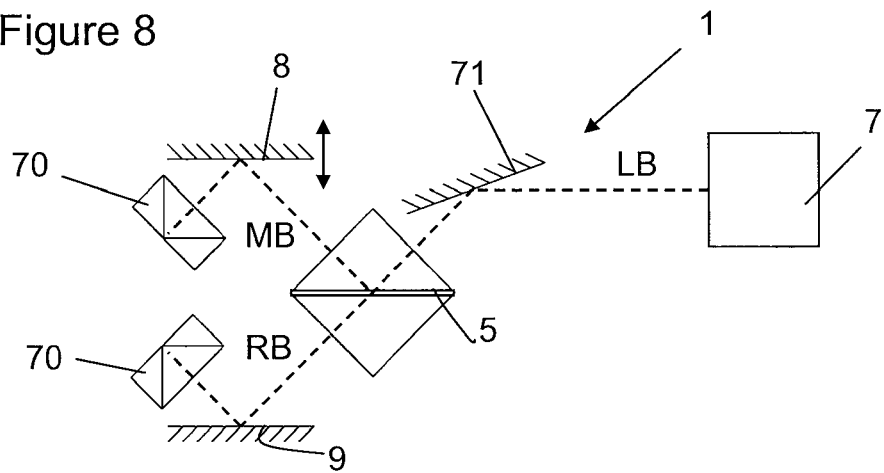
Figure 9:
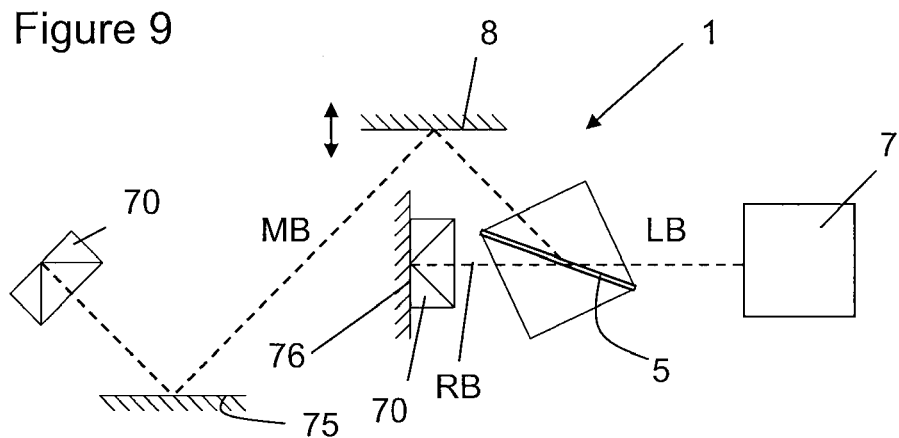
Figure 10:
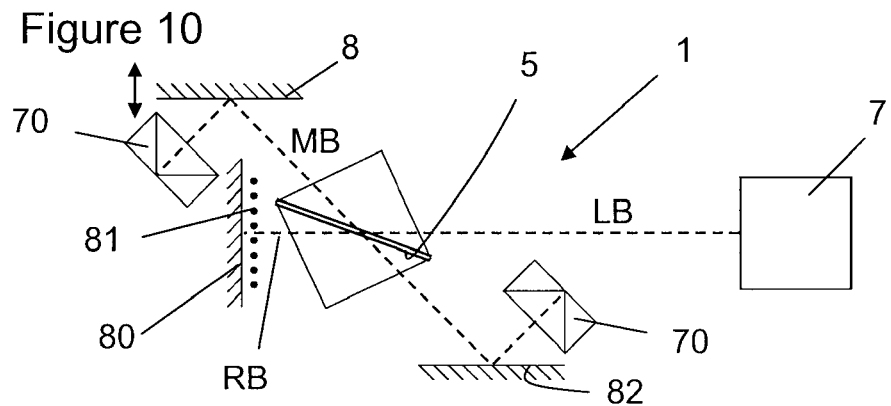

FIGS. 8, 9, and 10 show further alternative embodiments of a position measurement system 1 according to the invention, in which use is made of one or more corner cubes 70 in order to compensate misalignment in any of the respective optical elements of the position measurement system 1.

In the embodiment of FIG. 8 the radiation beam LB of the radiation source and detection unit 7 is reflected at the reflective surface 71 and split at the beam splitter 5 in a measurement beam MB and reference beam RB. The measurement beam MB runs via the first reflective surface 8 on the movable object, via the reflective surfaces 72 and 9 to the corner cube 70 which reflects the measurement beam MB back over the same path towards the radiation source and detection unit 7. The reference beam RB runs to the corner cube 70 which reflects the measurement beam RB back over the same path towards the radiation source and detection unit 7. Any misalignment in the optical components of one or the respective radiation paths is compensated by the reflection in the corner cubes 70.

The corner cubes 70 may be arranged on any suitable object, for instance on the movable object and the reference object, respectively.

In the embodiment of FIG. 9, the measurement beam MB runs via the first reflective surface 8 on the movable object and a further reflective surface 75 on another object towards the corner cube 70 mounted on the further object, and from there via the reverse path back to the beam splitter 5. The position measurement system 1 is configured to measure any change in a position quantity between the first reflective surface 8 and the further reflective surface 75.

The reference beam RB is reflected on a corner cube 70 on the reference object 76. In this embodiment the second reflective surface on the reference object 76 is formed by the corner cube 70. The position measurement 1 is configured to measure a position quantity between the first reflective surface 8 on the movable object and another reflective surface 75 on another object.

In the embodiment of FIG. 10, the measurement beam runs from the beam splitter 5 to the first reflective surface 8, via a quarter lambda plate 81 to the corner cube 70 where it is reflected via the same path to the beam splitter 5. The reference beam RB runs from the beam splitter 5 and as result it is reflected on the beam splitter 5 towards a reflective surface 82 on a reference object, where it is reflected via another quarter lambda plate 81 to a corner cube 70. From the corner cube 70 the reference beam is reflected back along the same path towards the radiation source and detection unit 7. As a result, the measurement beam MB is refracted by the beam splitter 5 towards a reflective surface 82 on a reference object where it is reflected via another quarter lambda plate 81 to a corner cube 70. From the corner cube 70 the measurement beam MB is reflected back along the same bath towards the radiation source and detection unit 7. At the beam splitter the paths of the measurement beam MB and the reference beam RB towards the radiation source and detection unit 7 join each other to obtain a signal which is representative for the change in a position quantity between the first reflective surface 8 and the reflective surface 82. In an alternative embodiment the reflective surface 80 may be replaced by a corner cube.

Again the corner cubes 70 may be used to compensate any misalignment of any of the reflective surfaces used in the position measurement system 1. The person skilled in the art may appreciate the fact that said reference surfaces and target surfaces of the embodiments as described according to FIGS. 2-10 may be part of the same movable body hence obtaining direct tilt metrology of said body.

Figure 11:
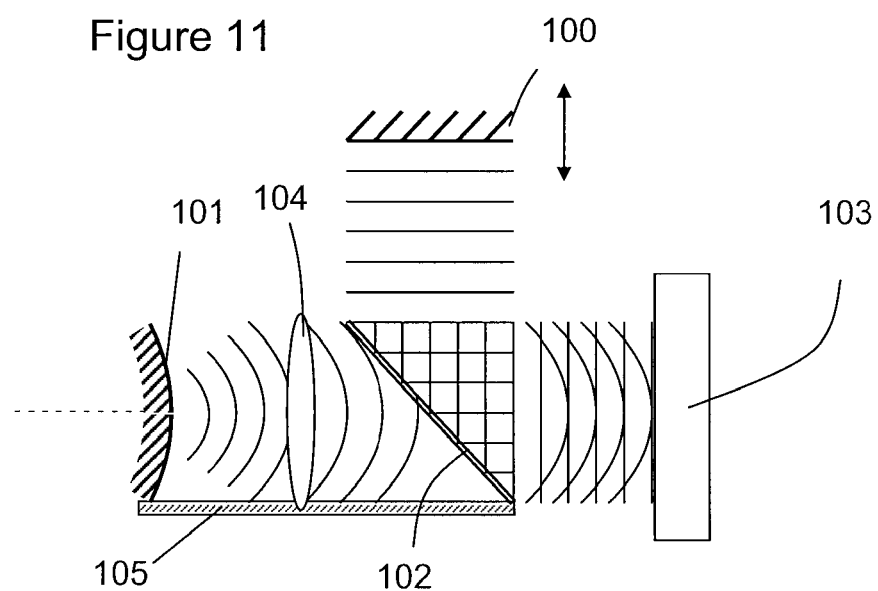
FIGS. 11 and 12 depict an embodiment of a measurement principle to be applied in a position measurement system according to the invention.

FIG. 11 shows another way of determining a position change between two reflective surfaces 100 and 101 arranged on a reference object and movable object.

A radiation source (not shown) is provided to emit a radiation wave with a flat wave front to a beam splitter 102. The reflected part of the radiation beam is reflected towards a flat reflective surface 100 which is provided on a movable object which is movable in the direction indicated by a double headed arrow.

The non-reflected part of the beam is guided to the convex reflective surface 101. This convex reflective surface 101 is arranged on a reference object 105. As a result, of the shape of the reflective surface 101, the wave front of the reflected beam reflected by the reflective surface 100 has a curved, convex shape. A positive lens element 104 is provided between the reflective surface 101 and the beam splitter 103 to generate a parallel reflected beam onto the beam splitter 102.

The reflective surface 100, the beam splitter 102, and a positive lens element 104 are provided on the reference object 105 so that the distance between the three parts is fixed. In an alternative embodiment, the beam splitter 102 may be fixed on the movable object or on a third object, wherein the third object is another object than the reference object or the target object.

The reflected measurement beam MB and reference beam RB as shown in FIG. 11 are combined at the beam splitter 102 and guided to an array of CCD elements 103. The combined reflected beams show due to the shape of the convex reflective surface 101 light-dark patterns which can be measured by the array of CCD elements 103. On the basis of analysis of these light-dark patterns, for instance fringe analysis, a signal representative for the movement of the reflective surface 101 and thus the movable object may be obtained. The light-dark patterns captured by the array of CCD elements 103 allow for 3D positioning information (X, Y and Z) at a single location.

In an alternative embodiment the convex reflective surface 101 and the positive lens element 104 may be provided on the movable object, while the flat reflective surface is provided on the reference object.

Figure 12:
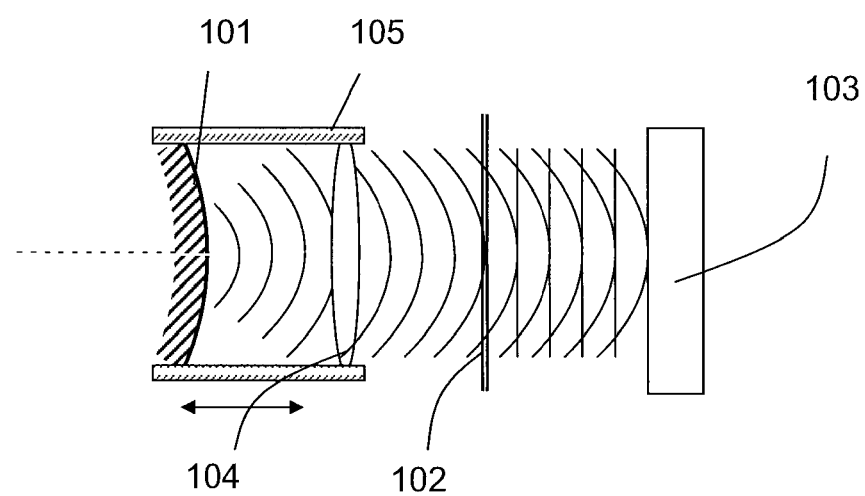

FIG. 12 shows an alternative embodiment of the position measurement system of FIG. 11. In this embodiment the reflective surface of the reference object is formed by the reflective surface of the beam splitter 102 itself, corresponding to the embodiment of FIG. 3. Thus, the beam splitter 5 is mounted on the reference object and the convex reflective surface 101 together with the positive lens element 104 is mounted on the movable object 105.

The radiation beam is split in a part that is reflected via the convex reflective surface 101, and a part that is directly reflected.

The combined beam of radiation beam of light reflected via reflective surface 102 and directly reflected radiation provides light-dark patterns on the array of CCD elements on the basis of which a signal representative for a position quantity of the movable object may be obtained. The light-dark patterns captured by the array of CCD elements 103 allow for a multiple degree of freedom measurement up to, for example, 6 degrees of freedom at a single location.

In the embodiments of FIGS. 11 and 12 one of the reflective surfaces has a flat surface while the other reflective surface has a curved, i.e. non-flat surface. In alternative embodiments, one reflective surface may have a curved surface such as convex, concave, spherical, parabolic, cylindrical or any other non-flat shape while the other reflective surface has a flat surface or curved surface, whereby the combination of shapes of the two reflective surfaces provides light-dark patterns on the basis of which a signal representative for the movement of one or both the reflective surfaces may be obtained.

It is remarked that one or more non-flat reflective surfaces in combination with the array of CCD elements as shown in FIGS. 11 and 12, may be applied in any of the measurement arrangements of FIG. 1-10, or any alternative thereof. The person skilled in the art may appreciate the fact that such type of fringe generation may be employed to detect surface and/or shape irregularities, imposed static, quasi-static and/or dynamic. This, as an example, in view of over-sensing, facilitating non-rigid body control strategies.

Figure 13:
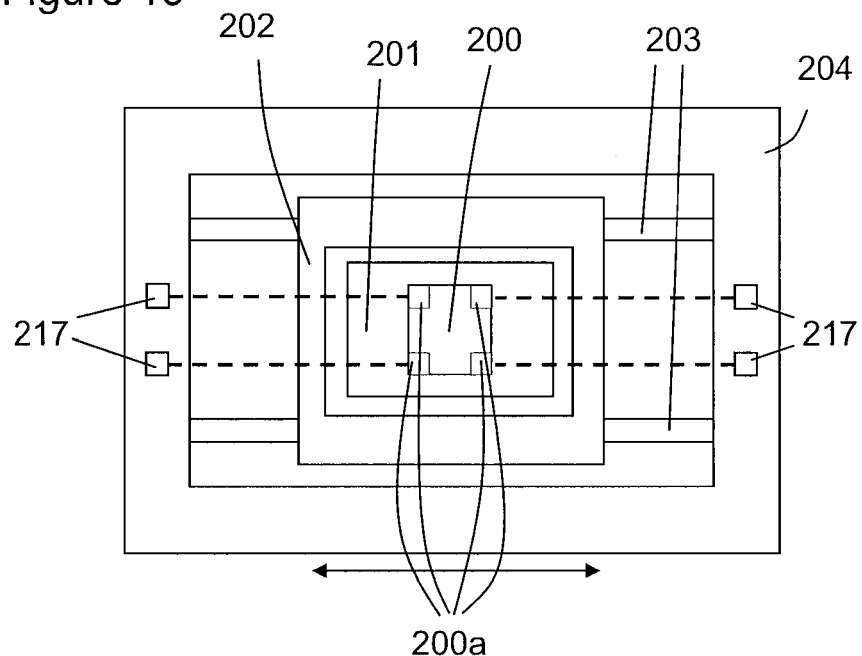
FIGS. 13 and 14 depict an application of a position measurement system according to an embodiment of the invention in a patterning device support stage system in top view and side view, respectively.
Figure 14:
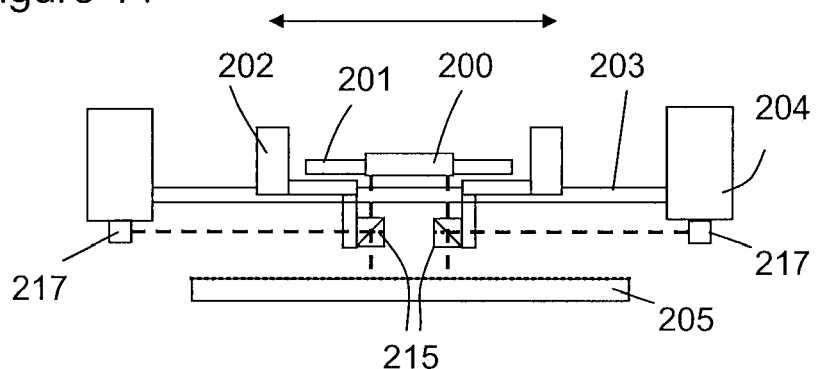

FIGS. 13 and 14 show an application of a position measurement system of the invention in a lithographic apparatus.

The patterning device 200 is supported by a patterning device support system including a short stroke part 201 which directly supports the patterning device 200. The short stroke part 201 is in its turn supported by a long stroke part 202 which is mounted on a long stroke guiding frame 203.

Such build-up of a patterning device support system in a lithographic apparatus is generally known. The short stroke part 201 is provided to make small movements in a small range with very high accuracy, while the long stroke part 202 is provided to move the short stroke part 201 in order to keep the desired location of the short stroke part 201 with respect to the projection system 205 within the small range of movement of the short stroke part 201. The short stroke part may include multiple bodies that are can be actuated separately.

To counteract reaction forces of actuation forces exerted by the long stroke actuators a balance mass 204 is provided so that the reaction forces do not lead to vibrations within the rest of the lithographic apparatus.

In this application the position measurement is used to directly measure the position of a patterning device 200 at four measurement locations 200a at four corners of the patterning device 200 with respect to the projection system 205. The position measurement system includes a radiation source and detection unit 217 and a beam splitter 215 for each of the four measurement locations 200a, i.e. reflective parts of the patterning device 200 available for position measurement. In addition thereto or as an alternative, measurement locations may be provided on other locations on the patterning device 200, or on the short stroke part 201 supporting the patterning device 201, or at any other suitable location.

In accordance with an aspect of the invention, the radiation source and detection units 217 of the position measurement system are provided on the balance mass 204 where there is relative a large volume available for the provision of such unit.

Further, the beam splitter 215 is mounted on the long stroke part 202 between the measurement locations 200a and a reflective surface of the projection system 205. Since the beam splitter 215 is mounted at the long stroke part 202, the beam splitters 215 move along with the patterning device 200 during any movements of the patterning device 200 indicated with the double headed arrows. As a result, the beam splitters 215 remain aligned with the measurement locations 200a on the patterning device 200. The reflective surface of the projection system 205 should extend over the whole range of movement of the patterning device in order to measure the position of the patterning device 200 over this whole range of movement.

The embodiment of FIGS. 13 and 14 gives an application of a position measurement system very similar to the embodiment shown in FIG. 5, whereby the intermediate object is the long stroke part 202, the reference object is the projection system 205 and the movable object is the patterning device 200. In an alternative embodiment, the intermediate object may be the short stroke part 201, i.e. the beam splitter 215 may be mounted on the short stroke part 215.

The location of the radiation source and detection unit 217 on the balance mass is very suitable to overcome problems of prior art position measurement devices, not only for interferometric systems as described in this application, but also other interferometric position measurement systems as well as diffractive position measurement systems. Further, this configuration may have benefits with respect to the alignment of the patterning device 200, the short stroke part 201 and the long stroke part 202.

Hereinabove, the use of reflective surfaces was described to reflect light/radiation beams. It is remarked that these reflective surfaces may be polarizing reflective surfaces in view of signal enhancement. The reflective surfaces may also include gratings or other refractive surfaces of which the zero order reflection is applied for metrology.

Further, the use of quarter lambda plates was described to obtain a phase shift in a light beam, and the use of a corner cube was described as a retroreflector. As an alternative, any phase shifter may be applied to obtain a suitable phase shift in a light/radiation beam, and any retroreflector, such as a cats eye or rooftop prism may be used to reflect a light/radiation beam parallel to the incoming light/radiation beam.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A position measurement system configured to measure a position quantity of a movable object in a measurement direction, the position measurement system comprising:
    a radiation source configured to emit a single radiation beam;
    a beam splitter configured to split the single radiation beam into a measurement beam and a reference beam;
    a first reflective surface mounted on the movable object and configured to receive the measurement beam;
    a second reflective surface mounted on a reference object and configured to receive the reference beam; and
    a detector arranged to receive a first reflected beam reflected by the first reflective surface and a second reflected beam reflected by the second reflective surface, the detector configured to provide a signal representative of the position quantity of the movable object on the basis of the first and the second reflected beam,
    wherein the radiation source and the detector are mounted on another object that is different from the movable object and the reference object, and
    wherein the other object is a balance mass of a stage system.

2. The position measurement system of claim 1, wherein the beam splitter is spaced from the radiation source and the detector, and arranged closer to the movable object and/or reference object than the radiation source and the detector.

3. The position measurement system of claim 1, wherein the beam splitter is arranged on the reference object.

4. The position measurement system of claim 1, wherein the position measurement system comprises a retroreflector arranged to receive the first reflected beam reflected by the first reflective surface to reflect the first reflected beam back to the first reflective surface before the first reflected beam is received by the detector, and/or arranged to receive the second reflected beam reflected by the second reflective surface to reflect the second reflected beam back to the second reflective surface before the second reflected beam is received by the detector.

5. The position measurement system of claim 1, wherein the beam splitter is arranged on an intermediate object arranged between the movable object and the reference object.

6. The position measurement system of claim 1, wherein an intermediate object is arranged between the movable object and the reference object, and wherein a first and a second intermediate reflective surface are arranged on the intermediate object, each intermediate reflective surface being arranged at an angle of about 45 degrees with the measurement direction, wherein the first intermediate reflective surface is arranged to guide the measurement beam to the movable object, and the second intermediate reflective surface is arranged to guide the reference beam to the reference object.

7. The position measurement system of claim 1, wherein the position quantity of the movable object with respect to the reference object is determined based on intensity changes in a combination of the first reflected beam and the second reflected beam.

8. The position measurement system of claim 1, wherein the position measurement system is configured to determine a position quantity of the movable object with respect to the reference object or with respect to a second movable or stationary object.

9. The positioning measurement system of claim 1, wherein the second reflective surface and first reflective surface are part of the same movable object.

10. The position measurement system of claim 1, wherein at least one of the first and the second reflective surface is curved, wherein the detector comprises an array of CCDs, and wherein the position quantity of the movable object with respect to the reference object is determined based on fringe analysis of an image captured by the array of CCDs.

11. The position measurement system of claim 1, wherein at least one of the first and second reflective surface is curved, wherein the detector comprises an array of CCDs, and wherein light-dark patterns captured by the array of CCDs are used for a multiple degree of freedom position information of the movable object.

12. The position measurement system according to claim 10, wherein the measurement system is configured to detect surface and/or shape irregularities.

13. The position measurement system according to claim 12, wherein the surface and/or shape irregularities have static, quasi-static and/or dynamic behavior.

14. A lithographic apparatus comprising:
a support constructed to support a patterning device, the patterning device being capable of imparting a beam of radiation with a pattern in its cross-section to form a patterned beam of radiation;
a substrate table constructed to hold a substrate;
a projection system configured to project the patterned beam of radiation onto a target portion of the substrate; and
a position measurement system configured to measure a position quantity of a movable object in a measurement direction, the position measurement system comprising
a radiation source configured to emit a single radiation beam,
a beam splitter configured to split the single radiation beam in a measurement beam and a reference beam,
a first reflective surface mounted on the movable object configured to receive the measurement beam,
a second reflective surface mounted on a reference object configured to receive the reference beam, and
a detector arranged to receive a first reflected beam reflected by the first reflective surface and a second reflected beam reflected by the second reflective surface, the detector configured to provide a signal representative of the position quantity of the movable object on the basis of the first and the second beam,
wherein the radiation source and the detector are mounted on an object that is different from the movable object and the reference object, and
wherein the object is a balance mass of a stage system of the support or substrate table.

15. The lithographic apparatus of claim 14, wherein the movable object is the support or the substrate table, and wherein the reference object is the projection system.

16. The lithographic apparatus of claim 14, wherein an intermediate object is arranged between the movable object and the reference object, and wherein a first and a second intermediate reflective surface are arranged on the intermediate object, each intermediate reflective surface being arranged at an angle of about 45 degrees with the measurement direction, wherein the first intermediate reflective surface is arranged to guide the measurement beam to the movable object, and the second intermediate reflective surface is arranged to guide the reference beam to the reference object, the intermediate object being the support or the substrate table.

17. The lithographic apparatus of claim 14, wherein the position measurement system is configured to determine a position quantity of the movable object with respect to the reference object or with respect to a second movable or a stationary object.

18. A lithographic apparatus comprising:
a support constructed to support a patterning device, the patterning device being capable of imparting a beam of radiation with a pattern in its cross-section to form a patterned beam of radiation;
a substrate table constructed to hold a substrate;
a projection system configured to project the patterned beam of radiation onto a target portion of the substrate;
a position measurement system configured to measure a position quantity of a movable object in a measurement direction, the position measurement system comprising
a radiation source to emit a single radiation beam,
a first reflective and/or diffractive surface mounted on the movable object configured to receive a measurement beam generated by said single radiation beam,
a second reflective and/or diffractive surface mounted on a reference object configured to receive a reference beam generated by said single radiation beam, and
a detector arranged to receive a first beam from the first reflective and/or diffractive surface and a second beam from the second reflective and/or diffractive surface, the detector configured to provide a signal representative of the position quantity of the movable object on the basis of the first and the second beam,
wherein the radiation source and the detector are arranged on a balance mass of a stage system of the support or substrate table.

* * * * *